United States Patent
Yoo et al.

(10) Patent No.: US 10,043,856 B2
(45) Date of Patent: Aug. 7, 2018

(54) ORGANIC LIGHT EMITTING DISPLAY DEVICE AND ORGANIC LIGHT EMITTING STACKED STRUCTURE

(71) Applicant: LG DISPLAY CO., LTD., Seoul (KR)

(72) Inventors: Taesun Yoo, Goyang-si (KR); Hongseok Choi, Seoul (KR); Mi-Young Han, Paju-si (KR); JungSoo Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/808,027

(22) Filed: Nov. 9, 2017

(65) Prior Publication Data

US 2018/0069055 A1    Mar. 8, 2018

Related U.S. Application Data

(63) Continuation of application No. 15/181,793, filed on Jun. 14, 2016, now Pat. No. 9,842,885.

(30) Foreign Application Priority Data

Dec. 24, 2015 (KR) .......... 10-2015-0186231

(51) Int. Cl.
*H01L 51/50* (2006.01)
*H01L 27/32* (2006.01)

(52) U.S. Cl.
CPC ........ *H01L 27/3206* (2013.01); *H01L 51/504* (2013.01); *H01L 51/5024* (2013.01); *H01L 51/5096* (2013.01)

(58) Field of Classification Search
CPC . H01L 51/50; H01L 51/5206; H01L 51/5024; H01L 51/5096; H01L 27/3206
See application file for complete search history.

(56) References Cited

U.S. PATENT DOCUMENTS

| 2004/0066138 A1 | 4/2004 | Kanno .............. H01J 1/68 313/506 |
| 2009/0045736 A1 | 2/2009 | Kho ................ H01L 51/5036 313/504 |
| 2009/0115319 A1 | 5/2009 | Kim ................ H01L 51/5265 313/504 |
| 2011/0073844 A1 | 3/2011 | Pieh et al. |
| 2013/0134410 A1* | 5/2013 | Kim ................ H01L 51/0039 257/40 |
| 2014/0326957 A1* | 11/2014 | Lee ................. H01L 51/504 257/40 |

(Continued)

FOREIGN PATENT DOCUMENTS

KR    10-2011-0035048 A    4/2011

*Primary Examiner* — Phuc Dang
(74) *Attorney, Agent, or Firm* — Dentons US LLP

(57) ABSTRACT

Disclosed is an organic light emitting display device. The organic light emitting display device includes an emission part which is disposed between an anode and a cathode and includes an emission layer. The emission part includes at least two emission layers emitting lights of different colors and a recombination zone movement prevention layer. The at least two emission layers each includes at least one host and at least one dopant, and the recombination zone movement prevention layer is disposed on a specific emission layer among the at least two emission layers.

21 Claims, 5 Drawing Sheets

(56) References Cited

U.S. PATENT DOCUMENTS

| | | | |
|---|---|---|---|
| 2015/0060808 A1 | 3/2015 | Kim | H01L 51/0052 257/40 |
| 2015/0155497 A1 | 6/2015 | Lee | H01L 51/0061 257/40 |
| 2015/0188074 A1 | 7/2015 | Heo | H01L 51/5044 257/40 |
| 2015/0279909 A1* | 10/2015 | Tsuji | H01L 51/504 257/40 |
| 2015/0287951 A1* | 10/2015 | Yamamoto | H01L 51/5004 257/40 |
| 2016/0118625 A1* | 4/2016 | Uesaka | H01L 27/3213 257/40 |
| 2016/0268513 A1* | 9/2016 | Ishisone | H01L 51/0051 |
| 2017/0092870 A1* | 3/2017 | Kim | H01L 51/0052 |

* cited by examiner

ORGANIC LIGHT EMITTING DISPLAY DEVICE AND ORGANIC LIGHT EMITTING STACKED STRUCTURE

CROSS-REFERENCE TO RELATED APPLICATIONS

This application is a Continuation Application of U.S. patent application Ser. No. 15/181,793 filed Jun. 14, 2016, which claims the benefit of Korean Patent Application No. 10-2015-0186231 filed on Dec. 24, 2015, which is incorporated herein by reference for all purposes as if fully set forth herein.

BACKGROUND

Field

The present disclosure relates to an organic light emitting display device and an organic light emitting stacked structure. More particularly, the present disclosure relates to an organic light emitting display device and an organic light emitting stacked structure, in which efficiency or lifetime of the device is enhanced.

Discussion of the Related Art

As society advances to be more of an information-oriented society, the field of display devices which visually express an electrical information signal is rapidly advancing. Various display devices, having excellent performance in terms of thinness, lightness, and low power consumption, are being correspondingly developed.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

SUMMARY

Accordingly, the present disclosure is directed to provide an organic light emitting display device and an organic light emitting stacked structure that substantially obviate one or more problems due to limitations and disadvantages of the related art.

Organic light emitting display devices for emitting white light have been developed. The organic light emitting display devices are widely applied to various fields such as backlights, illumination, etc. and are being recognized as the most important display devices.

Examples of a method where an organic light emitting display device realizes white may include a single layer emission method, a multilayer emission method, a color conversion method, an element stacked method, etc. The multilayer emission method among the methods is being used at present. In the multilayer emission method, lights are respectively emitted from a plurality of layers, and white is realized by a combination of colors.

A white organic light emitting device emitting white light may have a structure which includes two emission layers having a complementary color relationship. For example, in an organic light emitting device which includes a blue emission layer and a yellow emission layer and emits white light, an EL peak is generated in a blue wavelength range and a yellow wavelength range, and thus, white light is emitted. In this case, the blue emission layer is formed of a fluorescence emitting material, and the yellow emission layer is formed of a phosphorescence emitting material. In this case, an emission efficiency of a yellow phosphorescence emission layer is relatively higher than that of a blue fluorescence emission layer, and thus, emission efficiency is reduced due to an efficiency difference between the yellow phosphorescence emission layer and the blue fluorescence emission layer. Moreover, since the yellow emission layer should realize green and red, red efficiency is reduced.

Therefore, the inventors recognize the above-described problems and have done various experiments for enhancing efficiency by further adding a red emission layer into one emission part. Through the various experiments, the inventors have invented an organic light emitting display device having a new structure and an organic light emitting stacked structure, in which efficiency is enhanced.

An aspect of the prevent disclosure is directed to provide an organic light emitting display device and an organic light emitting stacked structure, in which a red emission layer is provided in one emission part, and a recombination zone movement prevention layer is provided, thereby enhancing green efficiency and red efficiency and enhancing lifetime.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including an emission part which is disposed between an anode and a cathode and includes an emission layer, the emission part including at least two emission layers emitting lights of different colors, the at least two emission layers each including at least one host and at least one dopant, and a recombination zone movement prevention layer on a specific emission layer among the at least two emission layers.

The specific emission layer may include one among a yellow-green emission layer, a green emission layer, and a combination of a yellow-green emission layer and a green emission layer, and the recombination zone movement prevention layer may include a host which is the same as a host included in the yellow-green emission layer or the green emission layer.

The at least two emission layers may include one among a combination of a red emission layer and a yellow-green emission layer, a combination of a red emission layer and a green emission layer, and a combination of a red emission layer, a yellow-green emission layer, and a green emission layer.

The red emission layer may be disposed closer to the anode than the yellow-green emission layer or the green emission layer.

One among the yellow-green emission layer, the green emission layer, and the combination of the yellow-green emission layer and the green emission layer may include at least two zones which differ in content of the dopant, and the content of the dopant may decrease progressively closer to the cathode.

A ratio of a thickness of the red emission layer to a thickness of the recombination zone movement prevention layer may be 1:1 to 3:1.

The red emission layer may include a host, the host being a single host.

In another aspect of the present disclosure, there is provided an organic light emitting display device including an emission part which is disposed between an anode and a cathode and includes an emission layer, the emission layer including a first emission layer and a second emission layer emitting light of a color which differs from a color of light emitted from the first emission layer, wherein the emission part includes a recombination zone movement prevention layer on the second emission layer, and when a thickness of the first emission layer is A, a thickness of the second emission layer is B, and a thickness of the recombination zone movement prevention layer is C, $B > A \geq C$ is satisfied.

The thickness of the first emission layer may be within a range of one times to three times the thickness of the recombination zone movement prevention layer.

The first emission layer may include a red emission layer, and the second emission layer may include one among a yellow-green emission layer, a green emission layer, and a combination of a yellow-green emission layer and a green emission layer.

The first emission layer may include a single host, and the second emission layer may include a mixed host.

The second emission layer may further include at least one dopant and may include at least two zones which differ in content of the dopant, and the content of the dopant may decrease progressively closer to the cathode.

The recombination zone movement prevention layer may include a material which is the same as a host included in the second emission layer.

The first emission layer may be disposed closer to the anode than the second emission layer.

In another aspect of the present disclosure, there is provided an organic light emitting stacked structure that includes a first emission layer including a single host and at least one dopant, a second emission layer on the first emission layer, the second emission layer emitting light of a color, which differs from a color of light emitted from the first emission layer, and including at least one host and at least one dopant, and a function layer on the second emission layer, the function layer preventing efficiency of the second emission layer from being reduced due to an increase in thickness of the first emission layer.

The function layer may have hole-blocking characteristic for preventing moving of a hole of the second emission layer.

The function layer may include a material which is the same as a host included in the second emission layer.

A thickness of the second emission layer may be within four times a thickness of the first emission layer.

A thickness of the first emission layer may be equal to or greater than a thickness of the function layer.

The first emission layer may include a red emission layer, and the second emission layer may include one among a yellow-green emission layer, a green emission layer, and a combination of a yellow-green emission layer and a green emission layer.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
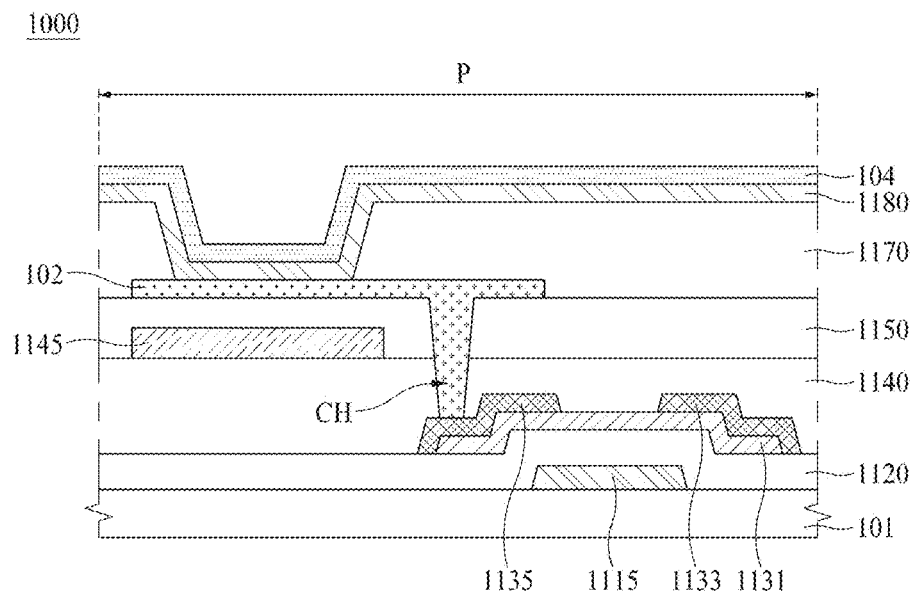
FIG. 1 is a diagram illustrating an organic light emitting display device according to first to third embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting display device 1000 according to first to third embodiments of the present disclosure.

Referring to FIG. 1, the organic light emitting display device 1000 may include a substrate 101, a first electrode 102, an emission part 1180, and a second electrode 104. The organic light emitting display device 1000 may include a plurality of pixels P. A pixel P denotes an area corresponding to a minimum unit of area where light is actually emitted, and may be referred to as a subpixel or a pixel area. Also, a certain plurality of pixels P may constitute a minimum group for realizing white light. For example, three pixels may constitute one group, namely, a red pixel, a green pixel, and a blue pixel may constitute one group. Alternatively, four pixels may constitute one group, namely, a red pixel, a green pixel, a blue pixel, and a white pixel may constitute one group. However, the present embodiment is not limited thereto, and various pixel designs may be made. In FIG. 1, for convenience of description, only one pixel P is illustrated.

A thin film transistor (TFT) may include a gate electrode 1115, a gate insulation layer 1120, a semiconductor layer 1131, a source electrode 1133, and a drain electrode 1135. The TFT may be disposed on the substrate 101 and may supply a signal to an organic light emitting device that includes the first electrode 102, the emission part 1180, and the second electrode 104. The TFT illustrated in FIG. 1 may be a driving TFT connected to the first electrode 102. A switching TFT or a capacitor for driving the organic light emitting device may be further disposed on the substrate 101. Also, in FIG. 1, the TFT is illustrated as having an inverted staggered structure, but may be formed in a coplanar structure.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The gate electrode 1115 may be formed on the substrate 101 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof.

The gate insulation layer 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulation layer 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter layer 1145 may be formed on the passivation layer 1140, and although only one pixel is illustrated in the drawing, the color filter layer 1145 may be formed in each of a red pixel, a blue pixel, and a green pixel. The color filter layer 1145 may include a red (R) color filter, a green (G) color filter, and a blue (B) color filter which are patterned and formed in respective pixels. The color filter layer 1145 transmits light having only a specific wavelength among white lights emitted from the emission part 1180.

An overcoating layer 1150 may be formed on the color filter layer 1145 and may be formed of an acryl resin, a polyimide resin, SiOx, SiNx, or a multilayer thereof, but is not limited thereto.

The first electrode 102 may be formed on the overcoating layer 1150 and may be formed of indium tin oxide (ITO) or indium zinc oxide (IZO) which is a transparent conductive material such as transparent conductive oxide (TCO), but is not limited thereto. The first electrode 102 may be electrically connected to the drain electrode 1135 through a contact hole CH which is formed in a certain area of the passivation layer 1140 and the overcoating layer 1150. In FIG. 1, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

The organic light emitting display device 1000 of FIG. 1 may be a bottom emission type, light emitted from the emission part 1180 may be transferred in a down direction through the first electrode 102. Also, when the organic light emitting display device 1000 is a top emission type, light emitted from the emission part 1180 may be transferred in an up direction through the second electrode 104.

A bank layer 1170 may be formed on the first electrode 102 and may define a pixel area. That is, the bank layer 1170 may be formed in a matrix structure in a boundary area between a plurality of pixels, and the pixel area may be defined by the bank layer 1170. However, the present embodiment is not limited thereto. The bank layer 1170 may be formed of an organic material such as a benzocyclobutene (BCB) resin, an acryl resin, a polyimide resin, and/or the like. The bank layer 1170 may be formed of a photosensitive material containing a black pigment. In this case, the bank layer 1170 may act as a light blocking member.

The emission part 1180 may be formed on the bank layer 1170 and the first electrode 102.

The second electrode 104 may be formed on the emission part 1180 and may be formed of gold (Au), silver (Ag), aluminum (Al), molybdenum (Mo), magnesium (Mg), and/or the like, or may be formed of an alloy thereof.

Moreover, an encapsulation part may be further formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

Figure 2:
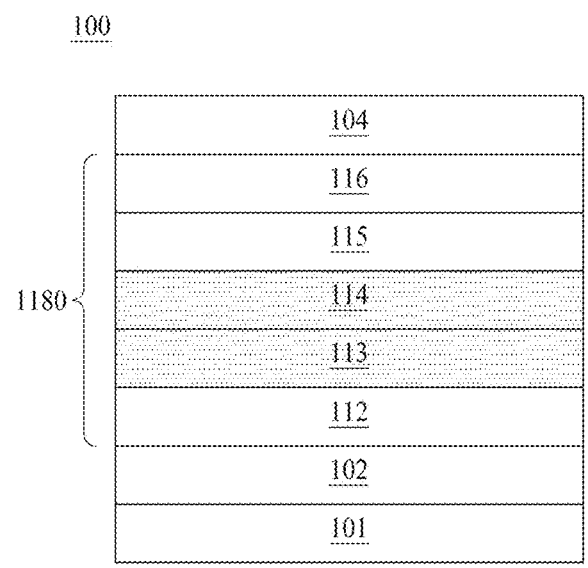
FIG. 2 is a diagram illustrating an organic light emitting device according to a first embodiment of the present disclosure.

FIG. 2 is a diagram illustrating an organic light emitting device 100 according to a first embodiment of the present disclosure.

The organic light emitting device 100 illustrated in FIG. 2 may include a substrate 101, a first electrode 102, a second electrode 104, and an emission part 1180 between the first and second electrodes 102 and 104.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 102 is an anode that supplies a hole, and may be formed of indium tin oxide (ITO), indium zinc oxide (IZO), or the like which is a transparent conductive material such as transparent conductive oxide (TCO). However, the present embodiment is not limited thereto.

The second electrode 104 is a cathode that supplies an electron, and may be formed of gold (Au), silver (Ag), aluminum (Al), molybdenum (Mo), magnesium (Mg), and/or the like which is a metal material, or may be formed of an alloy thereof. However, the present embodiment is not limited thereto.

Each of the first electrode 102 and the second electrode 104 may be referred to as an anode or a cathode. Alternatively, the first electrode 102 may be formed as a semitransmissive electrode or a transparent electrode, and the second electrode 104 may be formed as a reflective electrode. Alternatively, the first electrode 102 may be formed as a reflective electrode, and the second electrode 104 may be formed as a semitransmissive electrode or a transparent electrode.

The emission part 1180 may include a hole transport layer (HTL) 112, a first emission layer (EML) 113, a second EML 114, a recombination zone movement prevention layer 115, and an electron transport layer (ETL) 116 which are disposed on the first electrode 102.

A hole injection layer (HIL) may be further formed on the first electrode 102. The HIL may smoothly inject a hole, supplied from the first electrode 102, into the first EML 113 and the second EML 114.

The HTL 112 may supply a hole, supplied through the HIL, to the first EML 113 and the second EML 114. The ETL 116 may supply an electron, supplied from the second electrode 104, to the first EML 113 and the second EML 114. Therefore, the hole supplied through the HTL 112 and the electron supplied through the ETL 116 may be recombined in the first EML 113 and the second EML 114 to generate an exciton. A zone where the exciton is generated may be referred to as a recombination zone or an emission zone (or an emission area).

The ETL 116 may be formed of two or more layers or two or more materials. An electron injection layer (EIL) may be further formed on the ETL 116.

The ETL 116, a hole blocking layer (HBL), and an electron injection layer (EIL) may each be referred to as an electron transfer layer. That is, the electron transfer layer may be a layer for injecting or transferring an electron.

An electron blocking layer (EBL) may be further formed under the first EML 113. The EBL prevents an electron, injected into the first EML 113, from being transferred to the HTL 112 and thus enhances a combination of an electron and a hole in the first EML 113, thereby enhancing the emission efficiency of the first EML 113.

The HTL 112, the EBL, and the HIL may each be referred to as a hole transfer layer. That is, the hole transfer layer may be a layer for injecting or transferring a hole.

The first EML 113 may be formed as a red EML, and the second EML 114 may be formed as a yellow-green EML. When only a yellow-green EML is provided in one emission part, the yellow-green EML should emit green light and red light, causing a reduction in red efficiency. Therefore, a red EML may be further provided in the emission part 1180, for enhancing red efficiency.

The inventors have done an experiment for checking whether green efficiency and red efficiency are enhanced based on a thickness of the red EML. Through a result of the experiment, the inventors have recognized that when green efficiency is enhanced based on a thickness of the red EML which is the first EML 113, red efficiency is reduced, and when green efficiency is reduced, red efficiency is enhanced. That is, when a thickness of the red EML or a thickness of the yellow-green EML is adjusted based on a thickness of all organic layers configuring an organic light emitting display device and EMLs are each adjusted to a desired thickness, light is emitted from a desired emission zone, thereby enhancing efficiency of the organic light emitting display device. Therefore, when a thickness of the red EML increases, a thickness of the yellow-green EML is relatively reduced. An unrecombined hole of the yellow-green EML deviates from a recombination zone of the yellow-green EML and moves to an ETL adjacent to the yellow-green EML. Therefore, an exciton generated by a combination of a hole and an electron is dissipated in the yellow-green EML, causing a reduction in green efficiency. Also, when a thickness of the red EML is reduced, a thickness of the yellow-green EML increases relatively, and thus, the recombination zone of the yellow-green EML is maintained, thereby enhancing green efficiency. Therefore, when a thickness of the red EML which is the first EML 113 increases, red efficiency is enhanced, but green efficiency is reduced, whereby the inventors have recognized that it is difficult to enhance efficiency of the organic light emitting display device. Also, the inventors have recognized that when a thickness of the red EML which is the first EML 113 increases for enhancing red efficiency, an electroluminescence (EL) peak of each of the first EML 113 and the second EML 114 is affected by the increased thickness of the red EML 113 to cause a change in color coordinates, and for this reason, it is unable to realize a desired color.

Moreover, the inventors have done an experiment under a condition where a host included in the red EML which is the first EML 113 includes two hosts. That is, the red EML includes a mixed host including a hole-type host and an electron-type host which are the two hosts, and includes one dopant. Through a result of the experiment, the inventors have recognized that a combination of a hole and an electron in the red EML is enhanced by the mixed host, and thus, red efficiency is enhanced, but green efficiency is reduced. Also, since a content of a dopant should be relatively lower adjusted, it is difficult to control a content of dopants which are small in amount in a manufacturing process, and the emission efficiency of the red EML is reduced. Also, in a case of using the mixed host, since three deposition sources for a hole-type host, an electron-type host, and a dopant are needed for forming the red EML, an additional deposition source is further provided in a manufacturing process, and for this reason, it is difficult to adjust a ratio of the hole-type host to the electron-type host.

Therefore, the inventors have invented a new organic light emitting display device in which red efficiency is enhanced by adjusting a thickness of a red EML, and a recombination zone movement prevention layer is provided for preventing moving of a hole of a yellow-green EML, thereby maintaining green efficiency. That is, the recombination zone movement prevention layer prevents the hole of the yellow-green EML from deviating or moving from the yellow-green EML, thereby maintaining an emission zone or a recombination zone of the yellow-green EML. Also, the recombination zone movement prevention layer prevents the hole, transferred from the yellow-green EML, from moving to an interface of an ETL or a HTL, thereby preventing green efficiency from being reduced. Also, by adjusting a thickness of the red EML and a thickness of the recombination zone movement prevention layer, red efficiency is enhanced without a reduction in green efficiency. Also, a certain portion of a thickness of the yellow-green EML is provided as a thickness of the recombination zone movement prevention layer, and thus, a recombination zone of the yellow-green EML is maintained. Even when a thickness of the yellow-green EML is relatively reduced due to a thickness of the recombination zone movement prevention layer, the recombination zone movement prevention layer prevents a hole, which is not recombined in the yellow-green EML, from moving to the interface of the ETL or the HTL, and by adjusting injection of an electron into the yellow-green EML, a balanced recombination of a hole and an electron is induced, whereby green efficiency is not reduced.

Moreover, the recombination zone movement prevention layer is formed of a material which is the same as a host included in the yellow-green EML, and thus, a manufacturing process is simplified. That is, since the recombination zone movement prevention layer uses the material which is the same as a host included in the yellow-green EML, a deposition chamber is not separately provided. Also, since the recombination zone movement prevention layer is formed of the material which is the same as a host included in the yellow-green EML, interface characteristic for hole movement is enhanced in an interface between the yellow-green EML and the recombination zone movement prevention layer. Also, even when a content of a dopant included in the red EML increases, green efficiency is maintained, and red efficiency is enhanced, thereby overcoming a difficulty of a manufacturing process caused by a low content of a dopant and preventing the red efficiency of the red EML from being reduced.

Moreover, since a host included in the red EML includes a single host, efficiency of the red EML is easily adjusted. When a host included in the first EML 113 which is the red EML is an electron-type host, a hole of the HTL 112 is difficult to be transferred to the second EML 114, causing a reduction in efficiency of the second EML 114. Also, when the host included in the first EML 113 which is the red EML is a hole-type host, the hole of the HTL 112 is easily transferred to the second EML 114, thereby enhancing efficiency of the second EML 114. In this case, however, a problem where red efficiency is reduced due to the red EML 113 having the single host is solved by adjusting a content of a dopant included in the red EML or adjusting a thickness of the red EML. Therefore, the host included in the first EML 113 includes the hole-type host, and the content of the dopant included in the red EML which is the first EML 113 is adjusted to 2% to 6%. When the content of the dopant is less than 2%, it is difficult to adjust a small amount of dopant in a manufacturing process, and red efficiency is reduced. Also, by adjusting a thickness of the first EML 113 and a thickness of the recombination zone movement prevention layer 115, red efficiency is enhanced without any reduction in green efficiency. A thickness of the first EML 113 and a thickness of the recombination zone movement prevention layer 115 will be described below.

Moreover, the red EML which is the first EML 113 may be disposed closer to the anode, which is the first electrode 102, than the second EML 114. That is, when the second EML 114 is disposed closer to the anode, which is the first electrode 102, than the red EML which is the first EML 113, the red EML cannot emit light due to the second EML 114, causing a reduction in red efficiency. Particularly, when a host included in the red EML is an electron-type host, a problem where red light cannot be emitted due to the second EML 114 increases further. Accordingly, since the first EML 113 is disposed closer to the first electrode 102 than the second EML 114, red efficiency is prevented from being reduced.

Therefore, according to the present embodiment, the first EML 113 and the second EML 114 may be provided, and the recombination zone movement prevention layer 115 may be provided on the second EML 114. The recombination zone movement prevention layer 115 prevents a hole, injected into the second EML 114, from deviating or moving from the second EML 114, and thus, a combination of a hole and an electron in the second EML 114 is enhanced, thereby enhancing the emission efficiency of the second EML 114. That is, in order to prevent green efficiency from being reduced due to an increase in thickness of the red EML which is the first EML 113, the recombination zone movement prevention layer 115 may be provided for preventing a hole of the yellow-green EML from deviating or moving from the yellow-green EML which is the second EML 114, thereby maintaining a recombination zone of the second EML 114.

Moreover, the first EML 113 may be a red EML, an emission zone of the first EML 113 may be within a range of 600 nm to 650 nm. The second EML 114 may be formed as one among a yellow-green EML and a green EML. An emission zone of the second EML 114 may be within a range of 510 nm to 590 nm. Alternatively, the emission part 1180 may be configured with three EMLs. That is, the first EML 113 may be configured with a red EML, and the second EML 114 may be configured with a yellow-green EML and a green EML. Therefore, an EML configuring the emission part 1180 may be configured with at least two EMLs. The at least two EMLs may be one among a combination of a red EML and a yellow-green EML, a combination of a red EML and a green EML, and a combination of a red EML, a yellow-green EML and a green EML.

The first EML 113 may include a hole-type host which is a single host and at least one dopant. The hole-type host may be, for example, 1,3-bis(carbazol-9-yl)benzene (MCP), 4,4'-bis(carbazol-9-yl)biphenyl (CBP), or 4,4',4''-tris(carbazol-9-yl)triphenylamine (TcTa), but is not limited thereto.

The at least one dopant included in the first EML 113 may be, for example, bis(2-benzo[b]thiophen-2-yl-pyridine) (acetylacetonate)(iridium)(III) (Ir(btp)2(acac)), bis(1-phenylisoquinoline)(acetylacetonate)iridium(III) (Ir(piq)2 (acac)), tris(1-phenylisoquinoline)iridium(III) (Ir(piq)3), or 5,6,11,12-tetraphenylnaphthacene (Rubrene), but is not limited thereto.

The second EML 114 may include one or more of host materials, and examples of the one or more host materials may include 4,4'-bis(carbozol-9-yl)biphenyl (CBP), 1,3-bis (carbazol-9-yl)benzene (MCP), etc., but are not limited thereto. Also, a dopant included in the second EML 114 may include tris(2-phenylpyridine)iridium(III) (Ir(ppy)3), Bis(2-phenylpyridine)(acetylacetonate)iridium(III) (Ir(ppy)2 (acac)), and/or the like.

Moreover, the second EML 114 may include at least two zones which differ in content of dopants, and a content of dopants may decrease progressively closer to the cathode which is the second electrode 104. Accordingly, lifetime or efficiency of the second EML 114 is further enhanced. For example, among the at least two zones of the second EML 114, a first zone may be 20% in content of dopants, and a second zone may be 12% in content of dopants. Therefore, when the second EML 114 is configured with one among a yellow-green EML and a green EML, one among the yellow-green EML and the green EML may include at least two zones which differ in content of dopants. Also, when the second EML 114 is configured with a yellow-green EML and a green EML, each of the yellow-green EML and the green EML may include at least two zones which differ in content of dopants.

The recombination zone movement prevention layer 115 disposed on the second EML 114 which is a specific EML among at least two EMLs may be formed of a material which is the same as the host included in the second EML 114.

Moreover, the recombination zone movement prevention layer 115 may be a function layer. The function layer may be disposed on the second EML 114 and may be configured to prevent efficiency of the second EML 114 from being reduced due to an increase in thickness of the first EML 113. Also, the function layer may have hole-blocking characteristic for preventing a hole of the second EML 114 from deviating or moving from the second EML 114. Also, the function layer may be formed of a material which is the same as the host included in the second EML 114.

The HTL 112, the first EML 113, the second EML 114, the recombination zone movement prevention layer 115, the ETL 116, the EIL, the HIL, and the EBL which configure the emission part 1180 may each be referred to as an organic layer.

The organic light emitting device according to the first embodiment of the present disclosure may be applied to a bottom emission type, but is not limited thereto. In other embodiments, the organic light emitting device according to the first embodiment of the present disclosure may be applied a top emission type or a dual emission type. In the top emission type or the dual emission type, positions of EMLs may be changed depending on the characteristic or structure of a device.

In FIG. 2, an organic light emitting device including one emission part has been described above. An organic light emitting device including two or more emission parts will be described with reference to FIGS. 3 and 4.

Figure 3:
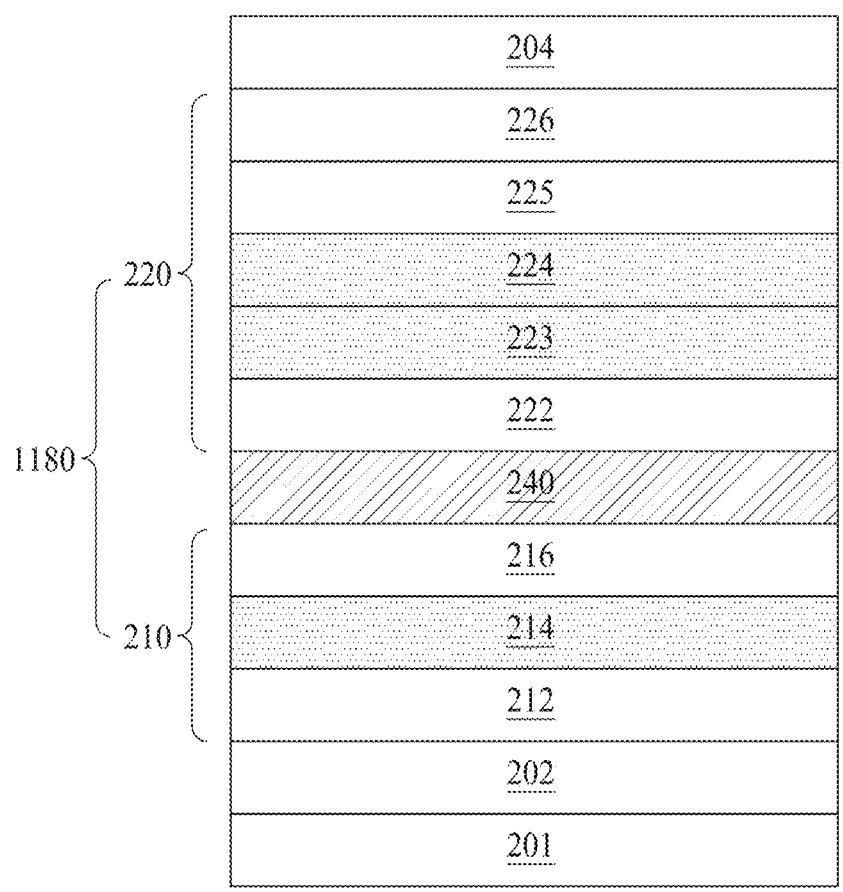
FIG. 3 is a diagram illustrating an organic light emitting device according to a second embodiment of the present disclosure.

FIG. 3 is a diagram illustrating an organic light emitting device 200 according to a second embodiment of the present disclosure.

Referring to FIG. 3, the organic light emitting device 200 according to the second embodiment of the present disclosure may include a substrate 201, a first electrode 202, a second electrode 204, and an emission part 1180 between the first electrode 202 and the second electrode 204. The emission part 1180 may include a first emission part 210 and a second emission part 220. The substrate 201, the first electrode 202, and the second electrode 204 illustrated in FIG. 3 may be substantially the same as the substrate 101, the first electrode 102, and the second electrode 104 described above with reference to FIG. 1. Thus, detailed descriptions of the substrate 201, the first electrode 202, and the second electrode 204 illustrated in FIG. 3 are not provided.

The first emission part 210 may include a first HTL 212, a first EML 214, and a first ETL 216 which are disposed on the first electrode 202.

Moreover, an HIL may be further formed on the first electrode 202. The HIL may smoothly inject a hole, supplied from the first electrode 202, into the first EML 214.

The first HTL 212 may supply a hole, supplied through the HIL, to the first EML 214. The first ETL 216 may supply an electron, supplied from the second electrode 104, to the first EML 214. Therefore, the hole supplied through the first HTL 212 and the electron supplied through the first ETL 216 may be recombined in the first EML 214 to generate an exciton. A zone where the exciton is generated may be referred to as a recombination zone or an emission zone (or an emission area).

The first ETL 216 may be formed of two or more layers or two or more materials. An EIL may be further formed on the first ETL 216.

The first ETL 216 and an EIL may each be referred to as an electron transfer layer. That is, the electron transfer layer may be a layer for injecting or transferring an electron.

An EBL may be further formed under the first EML 214. The EBL prevents an electron, injected into the first EML 214, from being transferred to the first HTL 212 and thus enhances a combination of an electron and a hole in the first EML 214, thereby enhancing the emission efficiency of the first EML 214. The first HTL 212 and the EBL may be provided as one layer.

The first HTL 212, the EBL, and the HIL may each be referred to as a hole transfer layer. That is, the hole transfer layer may be a layer for injecting or transferring a hole.

The first EML 214 may be an EML emitting light of a first color. That is, the first EML 214 may include one among a blue EML, a deep blue EML, and a sky blue EML. An emission zone of the first EML 214 may be within a range of 440 nm to 480 nm.

The first EML 214 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the first EML 214 is provided along with the auxiliary EML, the yellow-green EML, the red EML, or a green EML may be disposed on or under the first EML 214. Also, the yellow-green EML, the red EML, or the green EML may be identically or differently provided as the auxiliary EML on and under the first EML 214. The positions or number of EMLs may be selectively determined depending on a structure and a characteristic of a device, but the present embodiment is not limited thereto. When the first EML includes the auxiliary EML, an emission zone of the first EML 214 may be within a range of 440 nm to 650 nm.

The first EML 214 may include at least one host and dopant. Alternatively, the first EML 214 may include a mixed host, where two or more hosts are mixed, and at least one dopant. The mixed host may include a hole-type host and an electron-type host. The first EML 214 may include one or more host materials, and examples of the one or more host materials may include bis(2-methyl-8-quinolinolate)-4-(phenylphenolato)aluminum (BAlq), 4,4'-bis(2,2-diphenyl-vinyl)-1,1'-biphenyl (DPVBi), 9,10-di(naphth-2-yl)anthracene (ADN), etc., but are not limited thereto. The at least one dopant included in the first EML 214 may include a perylene group, bis(3,5-difluoro-2-(2-pyridyl)phenyl-(2-carboxy-pyridyl)iridium(III) (FIrPic), an anthanthrene group, and/or the like, but is not limited thereto.

The first HTL 212, the first EML 214, the first ETL 216, the EIL, the HIL, and the EBL which configure the first emission part 210 may each be referred to as an organic layer.

The second emission part 220 may include a second HTL 222, a second EML 223, a third EML 224, a recombination zone movement prevention layer 225, and a second ETL 226.

An EIL may be further formed on the second ETL 226. Also, an HIL may be further formed under the second HTL 222. Also, the second ETL 226 may be formed of two or more layers or two or more materials.

The second ETL 226, the HBL, and the EIL may each be referred to as an electron transfer layer. That is, the electron transfer layer may be a layer for injecting or transferring an electron.

An EBL may be further formed under the second EML 223. The EBL prevents an electron, injected into the second EML 223, from being transferred to the second HTL 222 and thus enhances a combination of an electron and a hole in the second EML 223, thereby enhancing the emission efficiency of the second EML 223. The second HTL 222 and the EBL may be provided as one layer.

The second HTL 222, the EBL, and the HIL may each be referred to as a hole transfer layer. That is, the hole transfer layer may be a layer for injecting or transferring a hole.

A hole supplied through the second HTL 222 and an electron supplied through the second ETL 226 may be recombined in the second EML 223 and the third EML 224 to generate an exciton. A zone where the exciton is generated may be referred to as a recombination zone or an emission zone (or an emission area).

The second EML 223 may be a red EML, and an emission zone of the second EML 223 may be within a range of 600 nm to 650 nm. The third EML 224 may be configured with one among a yellow-green EML and a green EML. An emission zone of the third EML 224 may be within a range of 510 nm to 590 nm. Alternatively, the second emission part 220 may be configured with three EMLs. That is, the second EML 223 may be configured with a red EML, and the third EML 224 may be configured with a yellow-green EML and a green EML. Therefore, an EML configuring the second emission part 220 may be configured with at least two EMLs. The at least two EMLs may be one among a combination of a red EML and a yellow-green EML, a combination of a red EML and a green EML, and a combination of a red EML, a yellow-green EML and a green EML. Accordingly, since the second EML 223 is disposed closer to the first electrode 202 than the third EML 224, red efficiency is prevented from being reduced.

The second EML 223 may include a hole-type host which is a single host and at least one dopant. The hole-type host may be, for example, 1,3-bis(carbazol-9-yl)benzene (MCP), 4,4'-bis(carbazol-9-yl)biphenyl (CBP), or 4,4',4"-tris(carbazol-9-yl)triphenylamine (TcTa), but is not limited thereto.

The at least one dopant included in the second EML 223 may be, for example, bis(2-benzo[b]thiophen-2-yl-pyridine)(acetylacetonate)(iridium)(III) (Ir(btp)2(acac)), bis(1-phenylisoquinoline)(acetylacetonate)iridium(III) (Ir(piq)2(acac)), tris(1-phenylisoquinoline)iridium(III) (Ir(piq)3), or 5,6,11,12-tetraphenylnaphthacene (Rubrene), but is not limited thereto. Therefore, a content of the dopant may be adjusted to 2% to 6%. When the content of the dopant included in the second EML 223 is adjusted to 2% or more, a difficulty of a manufacturing process caused by a low content of a dopant is overcome, and the emission efficiency of the red EML is prevented from being reduced due to the single host.

The third EML 224 may include at least one host and dopant. Alternatively, the third EML 224 may include a mixed host, where two or more hosts are mixed, and at least one dopant. The mixed host may include a hole-type host and an electron-type host. The third EML 224 may include one or more host materials, and examples of the one or more host materials may include 4,4'bis(carbozol-9-yl)biphenyl (CBP), 1,3-bis(carbazol-9-yl)benzene (MCP), etc., but are not limited thereto. The at least one dopant included in the third EML 224 may include tris(2-phenylpyridine)iridium (III) (Ir(ppy)3), Bis(2-phenylpyridine)(acetylacetonate) iridium(III) (Ir(ppy)2(acac)), etc., but is not limited thereto.

Moreover, the third EML 224 may include at least two zones which differ in content of dopants, and a content of dopants may decrease progressively closer to the cathode which is the second electrode 204. Accordingly, lifetime or efficiency of the third EML 224 is further enhanced. For example, among the at least two zones of the third EML 224, a first zone may be 20% in content of dopants, and a second zone may be 12% in content of dopants. Therefore, when the third EML 224 is configured with one among a yellow-green EML and a green EML, one among the yellow-green EML and the green EML may include at least two zones which differ in content of dopants. Also, when the third EML 224 is configured with a yellow-green EML and a green EML, each of the yellow-green EML and the green EML may include at least two zones which differ in content of dopants. Also, the recombination zone movement prevention layer 225 may be formed of a material which is the same as the host included in the third EML 224.

The recombination zone movement prevention layer 225 prevents a hole, injected into the third EML 224, from deviating or moving from the third EML 224, and thus, a combination of a hole and an electron in the third EML 224 is enhanced, thereby enhancing the emission efficiency of the third EML 224. That is, the recombination zone movement prevention layer 225 may be configured to prevent a hole of the yellow-green EML from deviating or moving from the yellow-green EML, which is the third EML 224, due to an increase in thickness of the red EML which is the second EML 223, thereby maintaining a recombination zone of the third EML 224.

Moreover, the recombination zone movement prevention layer 225 may be a function layer. The function layer may be disposed on the third EML 224 and may be configured to prevent efficiency of the third EML 224 from being reduced due to an increase in thickness of the second EML 223. Also, the function layer may have hole-blocking characteristic for preventing a hole of the third EML 224 from deviating or moving from the third EML 224. Also, the function layer may be formed of a material which is the same as the host included in the third EML 224.

The second HTL 222, the second EML 223, the third EML 224, the recombination zone movement prevention layer 225, the second ETL 226, the EIL, the HIL, and the EBL which configure the second emission part 220 may each be referred to as an organic layer.

A first charge generation layer (CGL) 240 may be further provided between the first emission part 210 and the second emission part 220. The first CGL 240 may adjust a charge balance between the first emission part 210 and the second emission part 220. The first CGL 240 may include a first N-type CGL and a first P-type CGL.

The first N-type CGL may inject an electron into the first emission part 210. The first P-type CGL may inject a hole into the second emission part 220. The first N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The first P-type CGL may be formed as an organic layer including a P-type dopant, but is not limited thereto. Also, the first CGL 240 may be formed of a single layer.

The organic light emitting device according to the second embodiment of the present disclosure may be applied to a bottom emission type, but is not limited thereto. In other embodiments, the organic light emitting device according to the second embodiment of the present disclosure may be applied a top emission type or a dual emission type. In the top emission type or the dual emission type, positions of EMLs may be changed depending on the characteristic or structure of a device.

Figure 4:
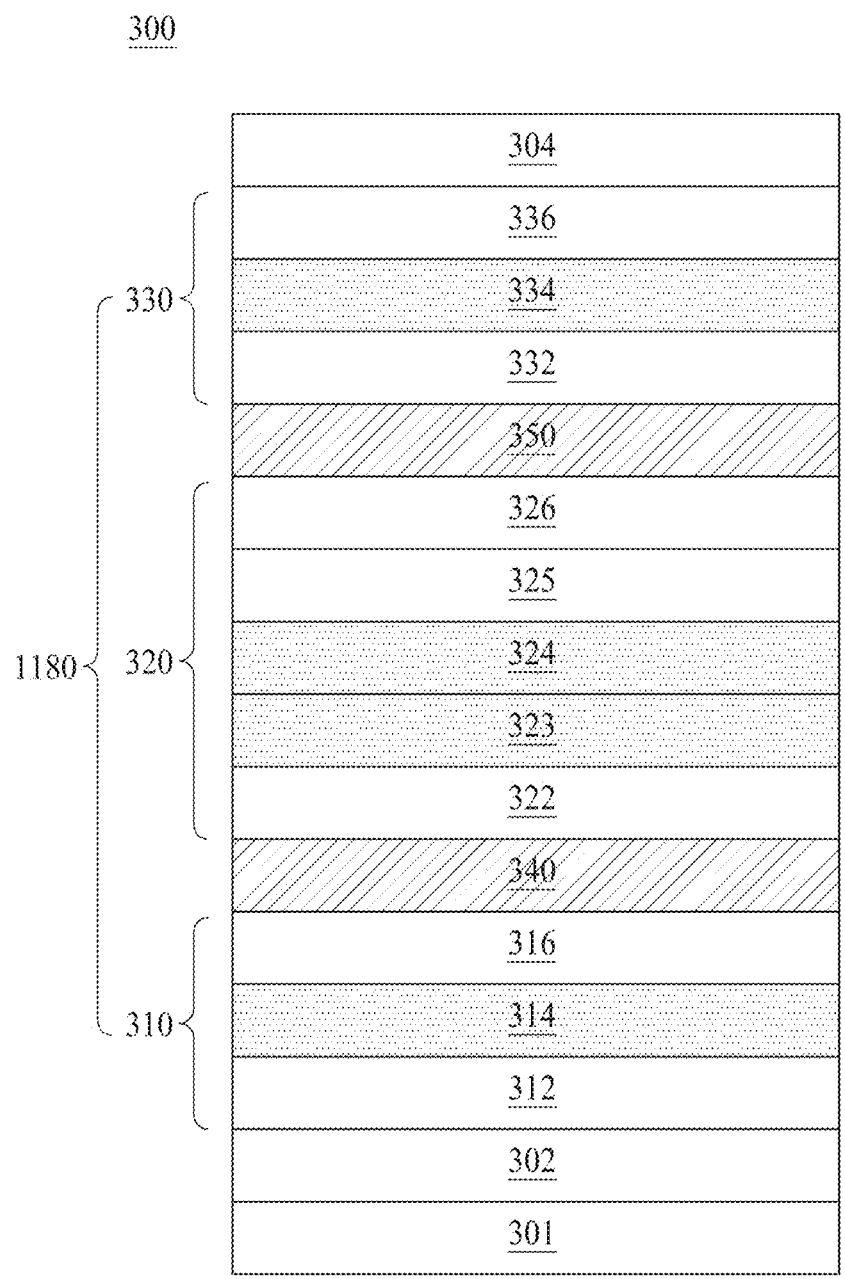
FIG. 4 is a diagram illustrating an organic light emitting device according to a third embodiment of the present disclosure.

FIG. 4 is a diagram illustrating an organic light emitting device 300 according to a third embodiment of the present disclosure.

Referring to FIG. 4, the organic light emitting device 300 according to the third embodiment may include a substrate 301, a first electrode 302, a second electrode 304, and an emission part 1180 between the first electrode 302 and the second electrode 304. The emission part 1180 may include a first emission part 310, a second emission part 320, and a third emission part 330. The substrate 301, the first electrode 302, and the second electrode 304 illustrated in FIG. 4 may be substantially the same as the substrate 101, the first electrode 102, and the second electrode 104 described above with reference to FIG. 1. Thus, detailed descriptions of the substrate 301, the first electrode 302, and the second electrode 304 illustrated in FIG. 4 are not provided.

The first emission part 310 may include a first HTL 312, a first EML 314, and a first ETL 316 which are disposed on the first electrode 302.

An HIL may be further formed on the first electrode 302. The HIL may smoothly inject a hole, supplied from the first electrode 302, into the first EML 314.

A hole supplied through the first HTL 312 and an electron supplied through the first ETL 316 may be recombined in the first EML 314 to generate an exciton. A zone where the exciton is generated may be referred to as a recombination zone or an emission zone (or an emission area).

The first ETL 316 may be formed of two or more layers or two or more materials. An EIL may be further formed on the first ETL 316.

An HBL may be further formed on the first EML 314. The first ETL 316 and the HBL may be provided as one layer.

The first ETL 316, the HBL, and the EIL may each be referred to as an electron transfer layer. That is, the electron transfer layer may be a layer for injecting or transferring an electron.

An EBL may be further formed under the first EML 314. The EBL prevents an electron, injected into the first EML 314, from being transferred to the first HTL 312 and thus enhances a combination of an electron and a hole in the first EML 314, thereby enhancing the emission efficiency of the first EML 314. The first HTL 312 and the EBL may be provided as one layer.

The first HTL 312, the EBL, and the HIL may each be referred to as a hole transfer layer. That is, the hole transfer layer may be a layer for injecting or transferring a hole.

The first EML 314 may be an EML emitting light of the first color. That is, the first EML 314 may include one among a blue EML, a deep blue EML, and a sky blue EML. An emission zone of the first EML 314 may be within a range of 440 nm to 480 nm.

The first EML 314 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the first EML 314 is provided along with the auxiliary EML, the yellow-green EML, the red EML, or a green EML may be disposed on or under the first EML 314. Also, the yellow-green EML, the red EML, or the green EML may be identically or differently provided as the auxiliary EML on and under the first EML 314. The positions or number of EMLs may be selectively determined depending on a structure and a characteristic of a device, but the present embodiment is not limited thereto. When the first EML includes the auxiliary EML, an emission zone of the first EML 314 may be within a range of 440 nm to 650 nm.

The first EML 314 may include at least one host and dopant. Alternatively, the first EML 314 may include a mixed host, where two or more hosts are mixed, and at least one dopant. The mixed host may include a hole-type host and an electron-type host. The first EML 314 may include one or more host materials, and examples of the one or more host materials may include bis(2-methyl-8-quinolinolate)-4-(phenylphenolato)aluminum (BAlq), 4,4'-bis(2,2-diphenyl-vinyl)-1,1'-biphenyl (DPVBi), 9,10-di(naphth-2-yl)anthracene (ADN), etc., but are not limited thereto. The at least one dopant included in the first EML 314 may include a perylene group, bis(3,5-difluoro-2-(2-pyridyl)phenyl-(2-carboxypyridyl)iridium(III) (FlrPic), an anthanthrene group, and/or the like, but is not limited thereto.

The first HTL 312, the first EML 314, the first ETL 316, the EIL, the HIL, the HBL, and the EBL which configure the first emission part 310 may each be referred to as an organic layer.

The second emission part 320 may include a second HTL 322, a second EML 323, a third EML 324, a recombination zone movement prevention layer 325, and a second ETL 326.

An EIL may be further formed on the second ETL 326. Also, an HIL may be further formed under the second HTL 322. Also, the second ETL 326 may be formed of two or more layers or two or more materials.

The second ETL 326, the HBL, and the EIL may each be referred to as an electron transfer layer. That is, the electron transfer layer may be a layer for injecting or transferring an electron.

An EBL may be further formed under the second EML 323. The second HTL 322 and the EBL may be provided as one layer. Also, the second HTL 322, the EBL, and the HIL may each be referred to as a hole transfer layer. That is, the hole transfer layer may be a layer for injecting or transferring a hole.

A hole supplied through the second HTL 322 and an electron supplied through the second ETL 326 may be recombined in the second EML 323 and the third EML 324 to generate an exciton. A zone where the exciton is generated may be referred to as a recombination zone or an emission zone (or an emission area).

The second EML 323 may be a red EML, and an emission zone of the second EML 323 may be within a range of 600 nm to 650 nm. The third EML 324 may be configured with one among a yellow-green EML and a green EML. An emission zone of the third EML 324 may be within a range of 510 nm to 590 nm. Alternatively, the second emission part 320 may be configured with three EMLs. That is, the second EML 323 may be configured with a red EML, and the third EML 324 may be configured with a yellow-green EML and a green EML. Therefore, an EML configuring the second emission part 320 may be configured with at least two EMLs. The at least two EMLs may be one among a combination of a red EML and a yellow-green EML, a combination of a red EML and a green EML, and a combination of a red EML, a yellow-green EML and a green EML. Accordingly, since the second EML 323 is disposed closer to the first electrode 302 than the third EML 324, red efficiency is prevented from being reduced.

The second EML 323 may include a hole-type host which is a single host and at least one dopant. The hole-type host may be, for example, 1,3-bis(carbazol-9-yl)benzene (MCP), 4,4'-bis(carbazol-9-yl)biphenyl (CBP), or 4,4',4''-tris(carbazol-9-yl)triphenylamine (TcTa), but is not limited thereto.

The at least one dopant included in the second EML 323 may be, for example, bis(2-benzo[b]thiophen-2-yl-pyridine) (acetylacetonate)(iridium)(III) (Ir(btp)2(acac)), bis(1-phenylisoquinoline)(acetylacetonate)iridium(III) (Ir(piq)2(acac)), tris(1-phenylisoquinoline)iridium(III) (Ir(piq)3), or 5,6,11,12-tetraphenylnaphthacene (Rubrene), but is not limited thereto. Therefore, a content of the dopant may be adjusted to 2% to 6%. When the content of the dopant in the second EML 323 is adjusted to 2% or more, a difficulty of a manufacturing process caused by a low content of a dopant is overcome, and the emission efficiency of the red EML is prevented from being reduced due to the single host.

The third EML 324 may include at least one host and dopant. Alternatively, the third EML 324 may include a mixed host, where two or more hosts are mixed, and at least one dopant. The mixed host may include a hole-type host and an electron-type host. The third EML 324 may include one or more host materials, and examples of the one or more host materials may include 4,4'-bis(carbozol-9-yl)biphenyl (CBP), 1,3-bis(carbazol-9-yl)benzene (MCP), etc., but are not limited thereto. The at least one dopant included in the third EML 324 may include tris(2-phenylpyridine)iridium (III) (Ir(ppy)3), Bis(2-phenylpyridine)(acetylacetonate)iridium(III) (Ir(ppy)2(acac)), etc., but is not limited thereto.

Moreover, the third EML 324 may include at least two zones which differ in content of dopants, and a content of dopants may decrease progressively closer to the cathode which is the second electrode 304. Accordingly, lifetime or efficiency of the third EML 324 is further enhanced. For example, among the at least two zones of the third EML 324, a first zone may be 20% in content of dopants, and a second zone may be 12% in content of dopants. Therefore, when the third EML 324 is configured with one among a yellow-green EML and a green EML, one among the yellow-green EML and the green EML may include at least two zones which differ in content of dopants. Also, when the third EML 324 is configured with a yellow-green EML and a green EML, each of the yellow-green EML and the green EML may include at least two zones which differ in content of dopants. Also, the recombination zone movement prevention layer 325 may be formed of a material which is the same as the host included in the third EML 324.

The recombination zone movement prevention layer 325 prevents a hole, injected into the third EML 324, from deviating or moving from the third EML 324, and thus, a combination of a hole and an electron in the third EML 324 is enhanced, thereby enhancing the emission efficiency of the third EML 324. That is, the recombination zone movement prevention layer 325 may be configured to prevent a hole of the yellow-green EML from deviating or moving from the yellow-green EML, which is the third EML 324, due to an increase in thickness of the red EML which is the second EML 323, thereby maintaining a recombination zone of the third EML 324.

Moreover, the recombination zone movement prevention layer 325 may be a function layer. The function layer may be disposed on the third EML 324 and may be configured to prevent efficiency of the third EML 324 from being reduced due to an increase in thickness of the second EML 323. Also, the function layer may have hole-blocking characteristic for preventing a hole of the third EML 324 from deviating or moving from the third EML 324. Also, the function layer may be formed of a material which is the same as the host included in the third EML 324.

The second HTL 322, the second EML 323, the third EML 324, the recombination zone movement prevention layer 325, the second ETL 326, the EIL, the HIL, and the EBL which configure the second emission part 320 may each be referred to as an organic layer.

A first CGL 340 may be further provided between the first emission part 310 and the second emission part 320. The first CGL 340 may adjust a charge balance between the first emission part 310 and the second emission part 320. The first CGL 340 may include a first N-type CGL and a first P-type CGL.

The first N-type CGL may inject an electron into the first emission part 310. The first P-type CGL may inject a hole into the second emission part 320. The first N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The first P-type CGL may be formed as an organic layer including a P-type dopant, but is not limited thereto. Also, the first CGL 340 may be formed of a single layer.

The third emission part 330 may include a third HTL 332, a fourth EML 334, and a third ETL 336 which are disposed on the second emission part 320.

An EIL may be further formed on the third ETL 336. Also, the third ETL 336 may be formed of two or more layers or two or more materials. Also, an HIL may be further formed under the third HTL 332.

An HBL may be further formed on the fourth EML 334. The third ETL 336 and the HBL may be provided as one layer. Also, the third ETL 336, the HBL, and the EIL may each be referred to as an electron transfer layer. That is, the electron transfer layer may be a layer for injecting or transferring an electron.

An EBL may be further formed under the fourth EML 334. The third HTL 332 and the EBL may be provided as one layer. Also, the third HTL 332, the EBL, and the HIL may each be referred to as a hole transfer layer. That is, the hole transfer layer may be a layer for injecting or transferring a hole.

A hole supplied through the third HTL 332 and an electron supplied through the third ETL 336 may be recombined in the fourth EML 334 to generate an exciton. A zone where the exciton is generated may be referred to as a recombination zone or an emission zone (or an emission area).

The fourth EML 334 may be an EML emitting light having the same color as the first color. That is, the fourth EML 334 may include one among a blue EML, a deep blue EML, and a sky blue EML. An emission zone of the fourth EML 334 may be within a range of 440 nm to 480 nm.

The fourth EML 334 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the fourth EML 334 is provided along with the auxiliary EML, the yellow-green EML, the red EML, or a green EML may be disposed on or under the fourth EML 334. Also, the yellow-green EML, the red EML, or the green EML may be identically or differently provided as the auxiliary EML on and under the fourth EML 334. The positions or number of EMLs may be selectively determined depending on a structure and a characteristic of a device, but the present embodiment is not limited thereto. When the fourth EML includes the auxiliary EML, an emission zone of the fourth EML 334 may be within a range of 440 nm to 650 nm.

The fourth EML 334 may include at least one host and dopant. Alternatively, the fourth EML 334 may include a mixed host, where two or more hosts are mixed, and at least one dopant. The mixed host may include a hole-type host and an electron-type host. The fourth EML 334 may include one or more host materials, and examples of the one or more host materials may include bis(2-methyl-8-quinolinolate)-4-(phenylphenolato)aluminum (BAlq), 4,4'-bis(2,2-diphenyl-vinyl)-1,1'-biphenyl (DPVBi), 9,10-di(naphth-2-yl)anthracene (ADN), etc., but are not limited thereto. The at least one dopant included in the fourth EML 334 may include a perylene group, bis(3,5-difluoro-2-(2-pyridyl)phenyl-(2-carboxypyridyl)iridium(III) (FIrPic), an anthanthrene group, and/or the like, but is not limited thereto.

The third HTL 332, the fourth EML 334, the third ETL 336, the EIL, the HIL, the HBL, and the EBL which configure the third emission part 330 may each be referred to as an organic layer.

A second CGL 350 may be further provided between the second emission part 320 and the third emission part 330. The second CGL 350 may adjust a charge balance between the second emission part 320 and the third emission part 330. The second CGL 350 may include a second N-type CGL and a second P-type CGL.

The second N-type CGL may inject an electron into the second emission part 320. The second P-type CGL may inject a hole into the third emission part 330. The second N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The second P-type CGL may be formed as an organic layer including a P-type dopant, but is not limited thereto. The second CGL 350 may be formed of a material which is the same as that of the first N-type CGL and first P-type CGL of the first CGL 340, but is not limited thereto. Also, the second CGL 350 may be formed of a single layer.

The organic light emitting device according to the third embodiment of the present disclosure may be applied to a bottom emission type, but is not limited thereto. In other embodiments, the organic light emitting device according to the third embodiment of the present disclosure may be applied a top emission type or a dual emission type. In the top emission type or the dual emission type, positions of EMLs may be changed depending on the characteristic or structure of a device.

A result obtained by measuring characteristic based on a thickness of a red EML and a thickness of a recombination zone movement prevention layer in an embodiment of the present disclosure will be described below with reference to the following Table 1 and FIGS. 5 to 8.

The following Table 1 shows a result obtained by measuring a driving voltage, efficiency, external quantum efficiency, and lifetime of a device in embodiments 1 to 3 of the present disclosure. Also, the embodiment 1 of the present disclosure is set to 100.0% and has been compared with the embodiments 2 and 3 of the present disclosure.

TABLE 1

| Division | Embodiment 1 | Embodiment 2 | Embodiment 3 |
|---|---|---|---|
| Driving Voltage (V) | 100.0% | 102.8% | 102.8% |
| Efficiency (cd/A) | 100.0% | 98.1% | 101.7% |
| EQE | 100.0% | 100.5% | 104.7% |
| Lifetime | 100.0% | 119.6% | 117.9% |

In Table 1, the embodiments 1 to 3 of the present disclosure have been experimented by applying the organic light emitting device of FIG. 2. Also, the driving voltage (V), the efficiency (cd/A), the external quantum efficiency (EQE), and the lifetime have been measured with respect to a current density of 10 mA/cm2.

In the embodiment 1 of the present disclosure, a thickness of a red EML is set to 10 nm, and a thickness of a recombination zone movement prevention layer is set to 10 nm. Also, the red EML is configured with an electron-type host which is a single host and one dopant, and a content of the dopant included in the red EML is set to 4%.

In the embodiment 2 of the present disclosure, a thickness of the red EML is set to 12 nm, and a thickness of the recombination zone movement prevention layer is set to 8 nm. Also, the red EML is configured with a host and a dopant identically to the embodiment 1, and a content of the dopant included in the red EML is set identically to the embodiment 1.

In the embodiment 3 of the present disclosure, a thickness of the red EML is set to 15 nm, and a thickness of the recombination zone movement prevention layer is set to 5 nm. Also, the red EML is configured with a host and a dopant identically to the embodiment 1, and a content of the dopant included in the red EML is set identically to the embodiment 1.

As shown in Table 1, it can be seen that the driving voltages (V) are almost equal in the embodiments 1 to 3 of the present disclosure. Also, it can be seen that the embodiment 3 of the present disclosure is enhanced further in efficiency (cd/A) than the embodiments 1 and 2 of the present disclosure. Also, the external quantum efficiency (EQE, %) denotes emission efficiency of when light is output to outside an organic light emitting device, and it can be seen that the embodiment 3 of the present disclosure is enhanced further in external quantum efficiency than the embodiments 1 and 2 of the present disclosure. Also, when initial emission luminance is 100%, it can be seen that in a time (i.e., a 95% lifetime (T95) of the organic light emitting device) taken until luminance is reduced by 95%, the embodiments 2 and 3 of the present disclosure are enhanced about 18% to 20% further in lifetime than the embodiment 1 of the present disclosure.

Therefore, since green efficiency is not reduced despite an increase in thickness of the red EML, it can be seen that the efficiency or external quantum efficiency of an organic light emitting display device is not reduced. Also, red efficiency is reduced because the red EML is formed of a single host, but it can be seen that by adjusting a thickness of the red EML and a thickness of the recombination zone movement prevention layer, efficiency is enhanced, and thus, lifetime is enhanced.

Figure 5:
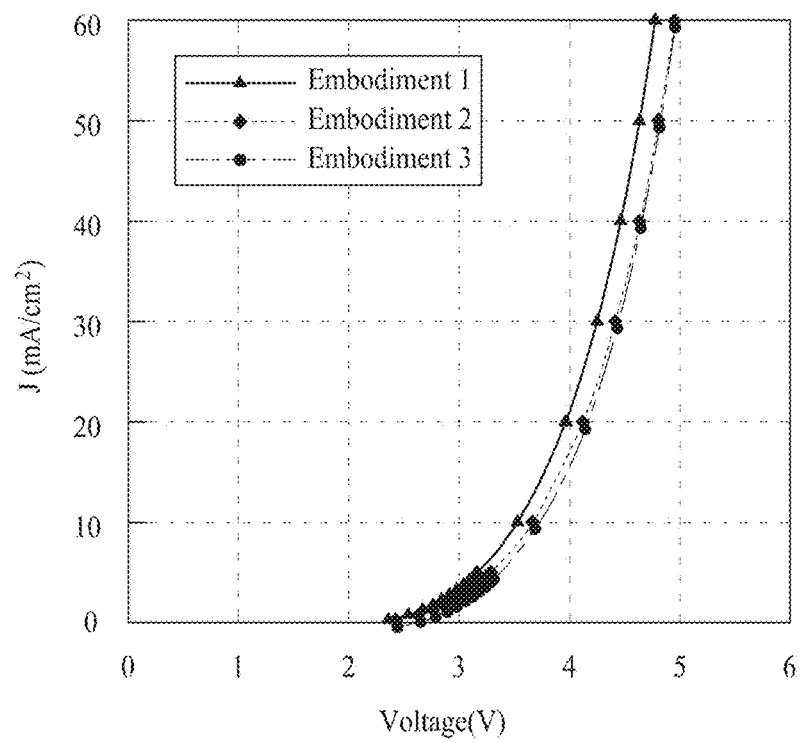
FIG. 5 is a diagram showing a voltage-current density according to embodiments 1 to 3 of the present disclosure.

FIG. 5 is a diagram showing a voltage-current density according to the embodiments 1 to 3 of the present disclosure. The organic light emitting display device described above with reference to Table 1 is applied to the embodiments 1 to 3 of the present disclosure.

In FIG. 5, the abscissa axis indicates a driving voltage (V), and the ordinate axis indicates a current density (J, mA/cm$^2$). As shown in FIG. 5, it can be seen that the embodiments 1 to 3 of the present disclosure is almost equal in driving voltage. Therefore, it can be seen that a thickness of the organic light emitting device increases because a thickness of the red EML increases or the recombination zone movement prevention layer is further provided, and the driving voltage does not increase.

Figure 6:
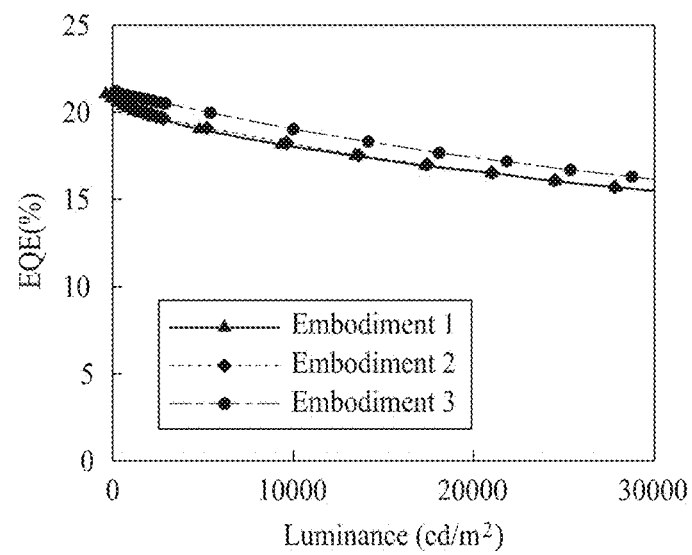
FIG. 6 is a diagram showing external quantum efficiency according to the embodiments 1 to 3 of the present disclosure.

FIG. 6 is a diagram showing external quantum efficiency according to the embodiments 1 to 3 of the present disclosure. The organic light emitting display device described above with reference to Table 1 is applied to the embodiments 1 to 3 of the present disclosure.

In FIG. 6, the abscissa axis indicates luminance (cd/m$^2$), and the ordinate axis indicates external quantum efficiency (EQE, %). As shown in FIG. 6, it can be seen that in the external quantum efficiency (EQE, %), the embodiment 3 of the present disclosure is further enhanced than the embodiments 1 and 2 of the present disclosure. Therefore, it can be seen that the host included in the red EML include a single host, and by adjusting a thickness of the red EML and a thickness of the recombination zone movement prevention layer, the external quantum efficiency is enhanced.

Figure 7:
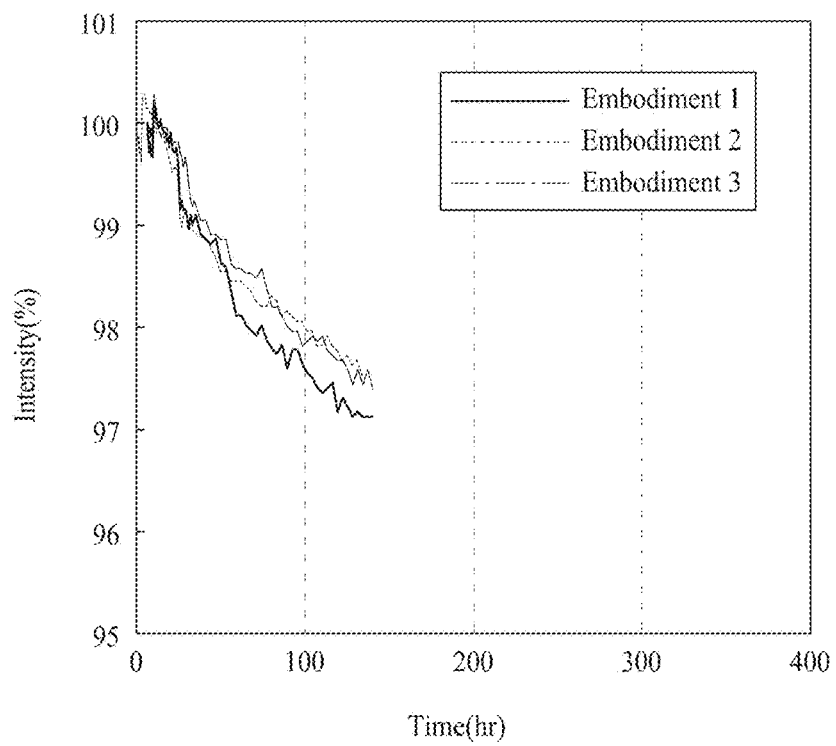
FIG. 7 is a diagram showing lifetime according to the embodiments 1 to 3 of the present disclosure.

FIG. 7 is a diagram showing lifetime according to the embodiments 1 to 3 of the present disclosure. The organic light emitting display device described above with reference to Table 1 is applied to the embodiments 1 to 3 of the present disclosure.

In FIG. 7, the abscissa axis indicates a time (hr), and the ordinate axis indicates intensity (%). As shown in FIG. 7, it can be seen that the embodiments 2 and 3 of the present disclosure are enhanced further in lifetime than the embodiment 1 of the present disclosure.

Figure 8:
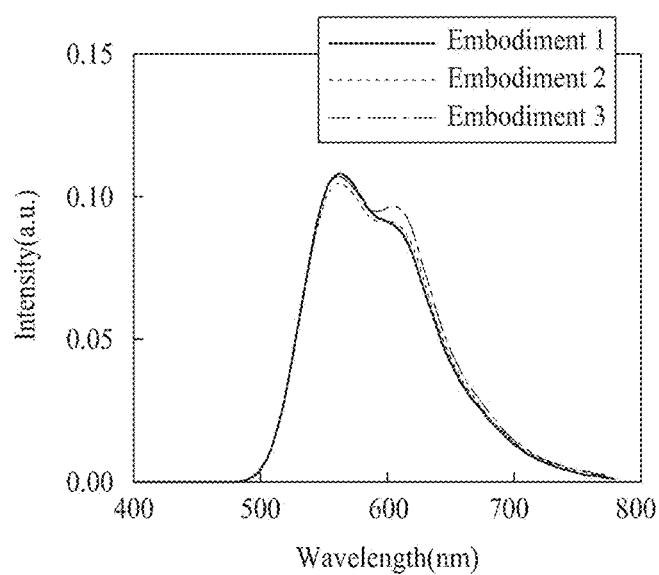
FIG. 8 is a diagram showing an electroluminescence (EL) spectrum according to the embodiments 1 to 3 of the present disclosure.

FIG. 8 is a diagram showing an electroluminescence (EL) spectrum according to the embodiments 1 to 3 of the present disclosure. The organic light emitting display device described above with reference to Table 1 is applied to the embodiments 1 to 3 of the present disclosure.

In FIG. 8, the abscissa axis indicates a wavelength (nm), and the ordinate axis indicates emission intensity (arbitrary unit (a.u.)). Also, a wavelength corresponding to a yellow-green emission zone is within a range of 520 nm to 580 nm, and a wavelength corresponding to a red emission zone is within a range of 600 nm to 650 nm.

As shown in FIG. 8, it can be seen that in the embodiments 1 to 3 of the present disclosure, emission intensity in a yellow-green emission zone is not reduced, and emission intensity in a red emission zone is enhanced. Therefore, it can be seen that even when a thickness of the red EML increases and a content of a dopant included in the red EML is set to 2% or more, emission intensity in the red emission zone increases, and emission intensity in the yellow-green emission zone is not reduced. Also, it can be seen that a host included in the red EML include a single host, and by adjusting a thickness of the red EML and a thickness of the recombination zone movement prevention layer, red efficiency which is reduced due to the single host is enhanced without any reduction in green efficiency. Also, it can be seen that red efficiency which is reduced due to the single host of the red EML is enhanced by increasing a content of a dopant. Also, an EL peak in the yellow-green emission zone and an EL peak in the red emission zone are maintained, and thus, a change in color coordinates is minimized, thereby realizing a desired color.

As described above, a thickness of the red EML may be equal to or greater than that of the recombination zone movement prevention layer. It can be seen that when a thickness of the red EML is within a range of one times to three times a thickness of the recombination zone movement prevention layer, red efficiency is maintained or enhanced without any reduction in green efficiency, and lifetime is enhanced. Also, a ratio of a thickness of the red EML to a thickness of the recombination zone movement prevention layer may be 1:1 to 3:1. That is, a thickness of the red EML may be 10 nm to 15 nm, and a thickness of the recombination zone movement prevention layer may be 5 nm to 10 nm.

Moreover, when a thickness of one among a yellow-green EML, a green EML, and a combination of a yellow-green EML and a green EML is within four times a thickness of a red EML, red efficiency is maintained or enhanced without any reduction in green efficiency. For example, when a thickness of the yellow-green EML, the green EML, or the combination of the yellow-green EML and the green EML is 40 nm, a thickness of the red EML may be 10 nm. Also, when a thickness of the yellow-green EML, the green EML, or the combination of the yellow-green EML and the green EML is 40 nm, a thickness of the recombination zone movement prevention layer may be adjusted to a certain thickness (for example, 5 nm to 10 nm) of the thickness.

Moreover, when a thickness of the red EML is A, a thickness of one among the yellow-green EML, the green EML, and the combination of the yellow-green EML and the green EML is B, and a thickness of the recombination zone movement prevention layer is C, B>A≥C is satisfied.

Moreover, red efficiency which is reduced due to the single host of the red EML is enhanced by adjusting a content of a dopant included in the red EML. The content of the dopant included in the red EML may be adjusted to 2% to 6%.

Therefore, the host included in the red EML includes a single host, and by adjusting a thickness of the red EML and a thickness of the recombination zone movement prevention layer, red efficiency is maintained or enhanced without any reduction in green efficiency, and lifetime is enhanced.

The above-described organic light emitting device may be applied to a lighting apparatus, may be used as a light source of a liquid crystal display (LCD) device, and may be applied to a display device. An organic light emitting display device including the organic light emitting device according to the first to third embodiments of the present disclosure may be a white organic light emitting display device that emits white light by using an emission part including at least two EMLs. Therefore, when the organic light emitting device according to the first to third embodiments of the present disclosure is applied to an organic light emitting display device, the organic light emitting display device may be implemented as a white organic light emitting display device including four pixels (for example, a white pixel, a red pixel, a green pixel, and a blue pixel). Also, an organic light emitting display device including the organic light emitting device according to the first to third embodiments of the present disclosure may be applied to a bottom emission display device, a top emission display device, a dual emission display device, a lighting device for vehicles, and/or the like. The lighting device for vehicles may be at least one among headlights, a high beam, taillights, a brake light, a back-up light, a fog lamp, a turn signal light, and an auxiliary lamp, but is not limited thereto. Alternatively, the organic light emitting display device including the organic light emitting device according to the first to third embodiments of the present disclosure may be applied to all indicator lamps which are used to secure a field of view of a driver and transmit or receive a signal of a vehicle. Also, the organic light emitting display device including the organic light emitting device according to the first to third embodiments of the present disclosure may be applied to mobile equipment, monitors, televisions (TVs), and/or the like.

As described above, according to the embodiments of the present disclosure, at least two EMLs emitting lights of different colors may be provided in one emission part, and a thickness of a red EML among the at least two EMLs may be adjusted, thereby providing an organic light emitting display device in which red efficiency is enhanced without any reduction in green efficiency, and lifetime is enhanced.

Moreover, according to the embodiments of the present disclosure, at least two EMLs emitting lights of different colors may be provided in one emission part, and by adjusting a thickness of a red EML among the at least two EMLs, an emission peak in a yellow-green emission zone and an emission peak in a red emission zone are maintained, thereby providing an organic light emitting display device that realizes a desired color by minimizing a change in color coordinates.

Moreover, according to the embodiments of the present disclosure, at least two EMLs emitting lights of different colors may be provided in one emission part, a thickness of a red EML among the at least two EMLs may be adjusted for enhancing red efficiency and the recombination zone movement prevention layer may be provided to prevent an emission zone of a yellow-green EML from moving into the yellow-green EML, thereby maintaining an emission zone of the yellow-green EML. Accordingly, provided is an organic light emitting display device in which green efficiency is prevented from being reduced due to the red EML and red efficiency is enhanced.

Moreover, according to the embodiments of the present disclosure, at least two EMLs emitting lights of different colors may be provided in one emission part, and the recombination zone movement prevention layer may be provided on a yellow-green EML among the at least two EMLs and may include a material which is the same as a host included in the yellow-green EML, thereby simplifying a manufacturing process and enhancing interface characteristic for hole movement in an interface between the yellow-green EML and the recombination zone movement prevention layer.

Moreover, according to the embodiments of the present disclosure, at least two EMLs emitting lights of different colors may be provided in one emission part, a host included in a red EML among the at least two EMLs may include a single host, and a content of a dopant included in the red EML may be adjusted, thereby overcoming a difficulty of a manufacturing process caused by the content of the dopant and minimizing a reduction in red efficiency of the red EML.

Moreover, according to the embodiments of the present disclosure, at least two EMLs emitting lights of different colors may be provided in one emission part, a thickness of a red EML among the at least two EMLs may be adjusted for enhancing red efficiency and the recombination zone movement prevention layer may be provided to prevent a hole of a yellow-green EML from deviating or moving from the yellow-green EML, thereby maintaining an emission zone of the yellow-green EML. Accordingly, provided is an organic light emitting display device in which green efficiency is prevented from being reduced due to the red EML and red efficiency is enhanced.

The details of the present disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device, comprising:
a first emission part on an anode, the first emission part having a first emission layer;
a second emission part on the first emission part, the second emission part having at least two emission layers, and a function layer, and an electron transfer layer on the function layer; and
a cathode on the function layer,
wherein the at least two emission layers comprises one among a combination of a red emission layer and a yellow-green emission layer, a combination of a red emission layer and a green emission layer, and a combination of a red emission layer, a yellow-green emission layer, and a green emission layer,
wherein each of the at least two emission layers includes at least one host and at least one dopant, and
wherein the function layer comprises a host which is the same as a host in the yellow-green emission layer or the green emission layer, and is provided between the electron transfer layer and the at least two emission layers.

2. The organic light emitting display device of claim 1, wherein the red emission layer is disposed closer to the anode than the yellow-green emission layer or the green emission layer.

3. The organic light emitting display device of claim 1, wherein the function layer is provided on the yellow-green emission layer or the green emission layer.

4. The organic light emitting display device of claim 1, wherein the function layer has hole-blocking characteristic.

5. The organic light emitting display device of claim 1, wherein one among the yellow-green emission layer, the green emission layer, and the combination of the yellow-green emission layer and the green emission layer comprises at least two zones including a dopant which differ in content of the dopant, and the content of the dopant decreases progressively closer to the cathode.

6. The organic light emitting display device of claim 1, wherein a ratio of a thickness of the red emission layer to a thickness of the function layer is 1:1 to 3:1.

7. The organic light emitting display device of claim 1, wherein the first emission layer includes one among a blue emission layer, a deep blue emission layer, and a sky blue emission layer.

8. The organic light emitting display device of claim 1, further comprising a charge generation layer between the first emission part and the second emission part.

9. The organic light emitting display device of claim 1, further comprising:
a third emission part on the second emission part, the third emission part having a second emission layer; and
a charge generation layer between the second emission part and the third emission part.

10. The organic light emitting display device of claim 9, wherein the second emission layer includes one among a blue emission layer, a deep blue emission layer, and a sky blue emission layer.

11. An organic light emitting display device, comprising:
a first emission part on an anode, the first emission part having a first emission layer;
a second emission part on the first emission part, the second emission part having a second emission layer, a third emission layer, and a function layer, and an electron transfer layer on the function layer, the function layer being provided between the electron transfer layer and the third emission layer;
a third emission part on the second emission part, the third emission part having a fourth emission layer; and
a cathode on the third emission part,
wherein the third emission layer is provided between the second emission layer and the function layer,
wherein the second emission layer emits light of a color which differs from a color of light emitted from the third emission layer, and
wherein the third emission layer comprises at least two zones including a dopant which differ in content of the dopant, and the content of the dopant decreases progressively closer to the cathode.

12. The organic light emitting display device of claim 11, wherein when a thickness of the second emission layer is A, a thickness of the third emission layer is B, and a thickness of the function layer is C, B>A~C is satisfied.

13. The organic light emitting display device of claim 12, wherein the thickness of the third emission layer is within four times the thickness of the second emission layer.

14. The organic light emitting display device of claim 12, wherein a thickness of the second emission layer is equal to or greater than a thickness of the function layer.

15. The organic light emitting display device of claim 11, wherein the function layer comprises a host which is the same as a host included in the third emission layer.

16. The organic light emitting display device of claim 11, wherein content of a dopant of the second emission layer includes 2% to 6%.

17. The organic light emitting display device of claim 11, wherein the second emission layer is disposed closer to the anode than the third emission layer.

18. The organic light emitting display device of claim 11, wherein the function layer has hole-blocking characteristic.

19. The organic light emitting display device of claim 11, wherein the first emission layer and the fourth emission layer include one among a blue emission layer, a deep blue emission layer, and a sky blue emission layer.

20. The organic light emitting display device of claim 11, wherein the second emission layer includes a red emission layer, and the third emission layer includes one among a yellow-green emission layer, a green emission layer, and a combination of the yellow-green emission layer and the green emission layer.

21. The organic light emitting display device of claim 11, further comprising:
a first charge generation layer between the first emission part and the second emission part; and
a second charge generation layer between the second emission part and the third emission part.

* * * * *